United States Patent
Mikosz et al.

(10) Patent No.: US 6,324,073 B1
(45) Date of Patent: *Nov. 27, 2001

(54) CLAMPING ARRANGEMENT FOR COMPRESSION-MOUNTED POWER ELECTRONIC DEVICES

(75) Inventors: Richard P. Mikosz, Hickory Hills; Ronald D. Atanus, Mt. Prospect; Raymond P. O'Leary, Evanston, all of IL (US)

(73) Assignee: S&C Electric Co., Chicago, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,099

(22) Filed: Dec. 22, 1998

(51) Int. Cl.$^7$ ........................................................ H05K 7/02
(52) U.S. Cl. ..................... 361/809; 361/801; 361/728; 361/729; 361/730; 361/732; 257/727; 257/685; 257/686; 257/718; 257/719
(58) Field of Search ..................... 257/727, 685, 257/686, 718, 719; 361/728–729, 730, 732, 801, 809

(56) References Cited

U.S. PATENT DOCUMENTS

| | | |
|---|---|---|
| 3,651,383 | 3/1972 | Livezey et al. . |
| 3,661,013 * | 5/1972 | Wilcox ................................... 73/141 |
| 3,688,159 * | 8/1972 | Robbins ................................ 317/100 |
| 3,867,003 | 2/1975 | Morton et al. . |
| 3,955,122 * | 5/1976 | Maynard et al. ..................... 317/100 |
| 3,982,308 | 9/1976 | Yoneda . |
| 4,097,036 | 6/1978 | Henke . |
| 4,636,917 | 1/1987 | Jouanny . |
| 5,483,103 | 1/1996 | Blickhan et al. . |
| 5,793,618 * | 8/1998 | Chan et al. ........................... 361/809 |

OTHER PUBLICATIONS

ABB Brochure 34–300, Sep. 1996, 4 pages.

"Switching Megawatts in Micro Seconds", Paper—PQA '97 North America, Mar. 3–6, 1997, 11 pages.

* cited by examiner

*Primary Examiner*—Jeffrey Gaffin
*Assistant Examiner*—Thanh Y. Tran

(57) ABSTRACT

A clamping arrangement is provided for compression mounted power electronic devices that is assembled from component parts to form a clamping module. The clamping module provides suitable clamping force to a power electronic device interposed between two heat sink arrangements. The clamping arrangement utilizes clamping beams disposed on either side of the two heat sinks and the interposed power electronic device, elongated members that span and retain each end of each clamping beam against relative movement, and an arrangement for applying a desired clamping force to the heat sinks and the power electronic device. The kit of component parts can be assembled into a clamping module about a power electronic device disposed between two heat sinks and is easily assembled or field disassembled from economical parts. The clamping modules are also adapted to be easily and efficiently combined into an overall stack of modules to provide a power electronic assembly of series connected power electronic devices for operation at medium voltages. In a preferred arrangement, the elongated members are implemented via the assembly of end cap assemblies about an elongated member. An arrangement to achieve predetermined clamping forces during assembly is also provided.

6 Claims, 4 Drawing Sheets

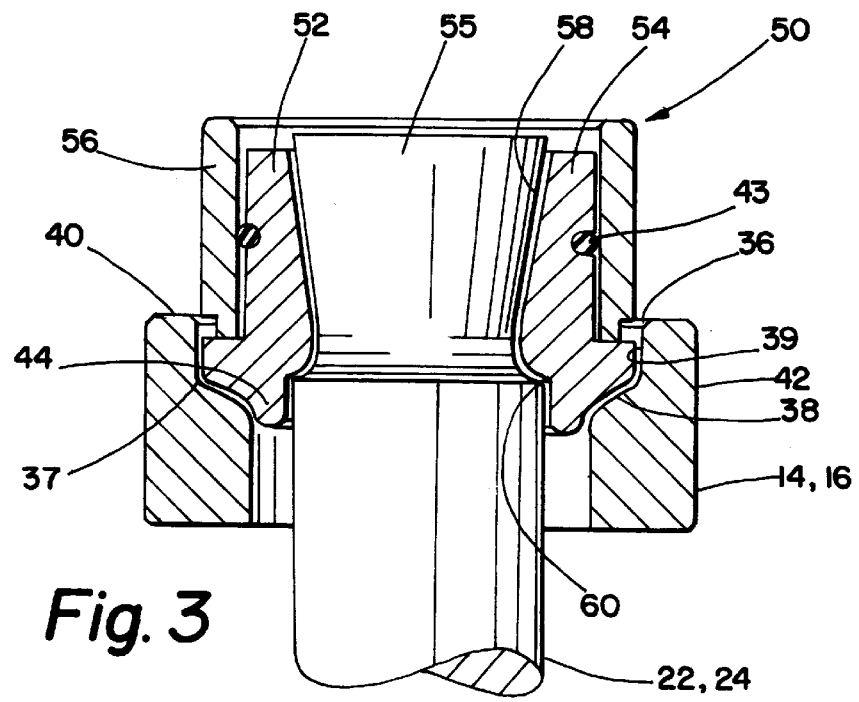
Fig. 3
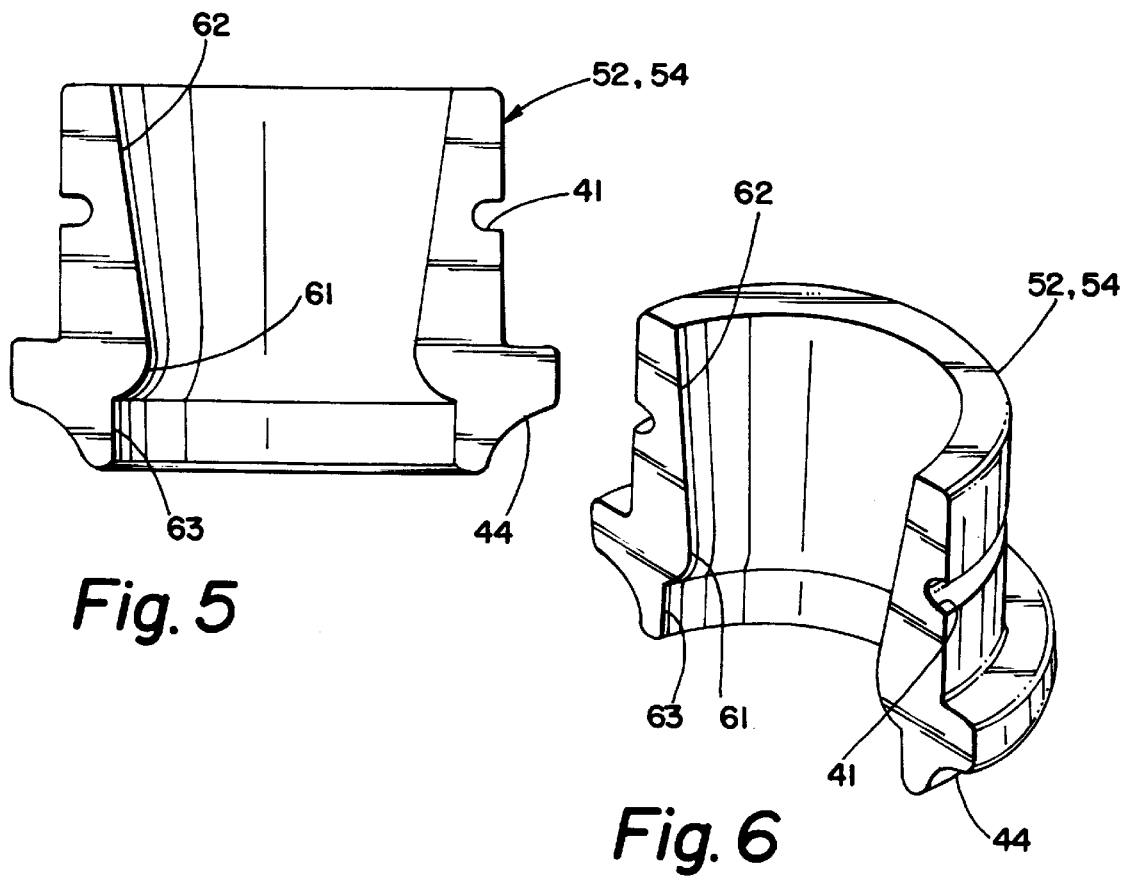
Fig. 5
Fig. 6

US 6,324,073 B1

CLAMPING ARRANGEMENT FOR COMPRESSION-MOUNTED POWER ELECTRONIC DEVICES

BACKGROUND OF THE INVENTION

1. Field of the Invention

The present invention relates generally to the field of clamping arrangements for compression-mounted power electronic devices such as thyristors, SCR's etc., and more particularly to improved arrangements for securing the clamping arrangement when clamping force is applied.

2. Description of the Related Art

Various clamping arrangements are known for compression mounted power electronic devices, i.e. where a power electronic device is clamped against a heat sink or other support member. For example, see the following U.S. Pat. Nos.: 3,661,013; 3,651,383; 3,688,159; 3,867,003; 3,982,308; 4,636,917; and 5,483,103. Additionally, commercial examples are found in an ABB brochure 34–300 (September 1996) and in a PQA '97 North America (Mar. 3–6, 1997) paper entitled "Switching Megawatts in Microseconds". Two types of clamping arrangements are described by these arrangements, a first type that clamps an overall stack of alternating electronic power devices with interposed heat sinks and a second type wherein clamping is accomplished for each sub-assembly of a power electronic device and a heat sink or the like, in some cases the sub-assemblies being combined in an overall stack arrangement.

While the prior art arrangements may provide useful clamping arrangements, these prior arrangements do not provide a compact, economical arrangement that is easily assembled or field disassembled from economical parts to form modules that are easily and efficiently combined into an overall stack of modules.

SUMMARY OF THE INVENTION

Accordingly, it is a principal object of the present invention to provide a clamping arrangement for compression mounted power electronic devices that is assembled from component parts to form a clamping module that provides clamping force to a power electronic device interposed between two heat sink arrangements.

It is another object of the present invention to provide a clamping arrangement that utilizes clamping beams disposed on either side of two heat sinks and an interposed power electronic device, elongated members that span and retain each end of each clamping beams against relative movement, and an arrangement for applying a desired clamping force to be heat sinks and the power electronic device.

It is a further object of the present invention to provide a kit of component parts that can be assembled into a clamping module about a power electronic device disposed between two heat sinks.

These and other objects of the present invention are efficiently achieved by the provision of a clamping arrangement for compression mounted power electronic devices that is assembled from component parts to form a clamping module. The clamping module provides suitable clamping force to a power electronic device interposed between two heat sink arrangements. The clamping arrangement utilizes clamping beams disposed on either side of the two heat sinks and the interposed power electronic device, elongated members that span and retain each end of each clamping beam against relative movement, and an arrangement for applying a desired clamping force to the heat sinks and the power electronic device. The kit of component parts can be assembled into a clamping module about a power electronic device disposed between two heat sinks and is easily assembled or field disassembled from economical parts. The clamping modules are also adapted to be easily and efficiently combined into an overall stack of modules to provide a power electronic assembly of series connected power electronic devices for operation at medium voltages. In a preferred arrangement, the elongated members are implemented via the assembly of end cap assemblies about an elongated member. An arrangement to achieve predetermined clamping forces during assembly is also provided.

BRIEF DESCRIPTION OF THE DRAWING

The invention, both as to its organization and method of operation, together with further objects and advantages thereof, will best be understood by reference to the specification taken in conjunction with the accompanying drawing in which:

FIG. 3 is an elevational view, partly in section, of an elongated member and an assembled end fitting of the clamping module of FIGS. 1 and 2;

FIGS. 5 and 6 are respective elevational and perspective views of a portion of the end fitting of FIG. 3;

DETAILED DESCRIPTION

Figure 1:
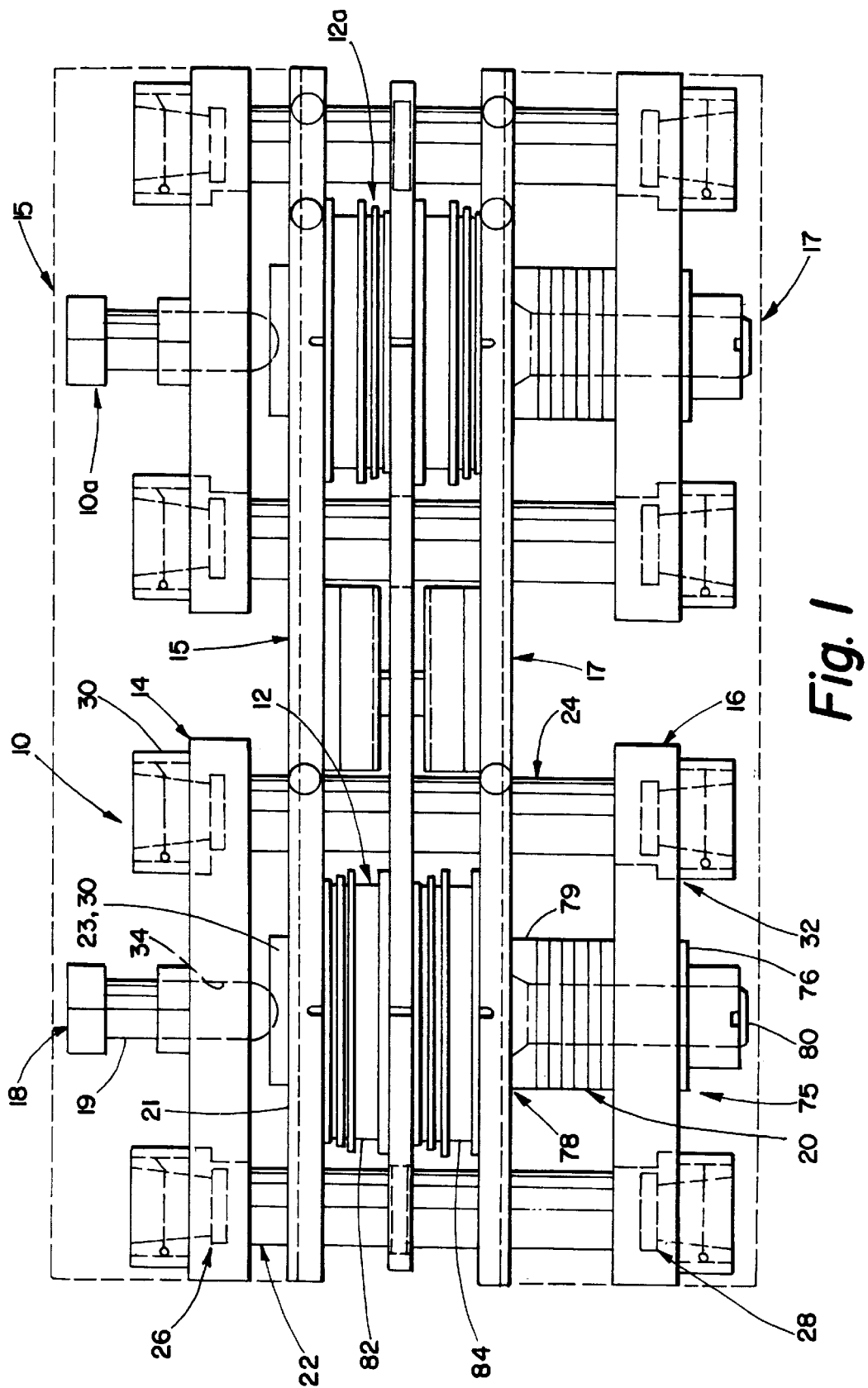
FIG. 1 is a front elevational view of a clamping module in accordance with the present invention, with some parts removed for clarity.
Figure 2:
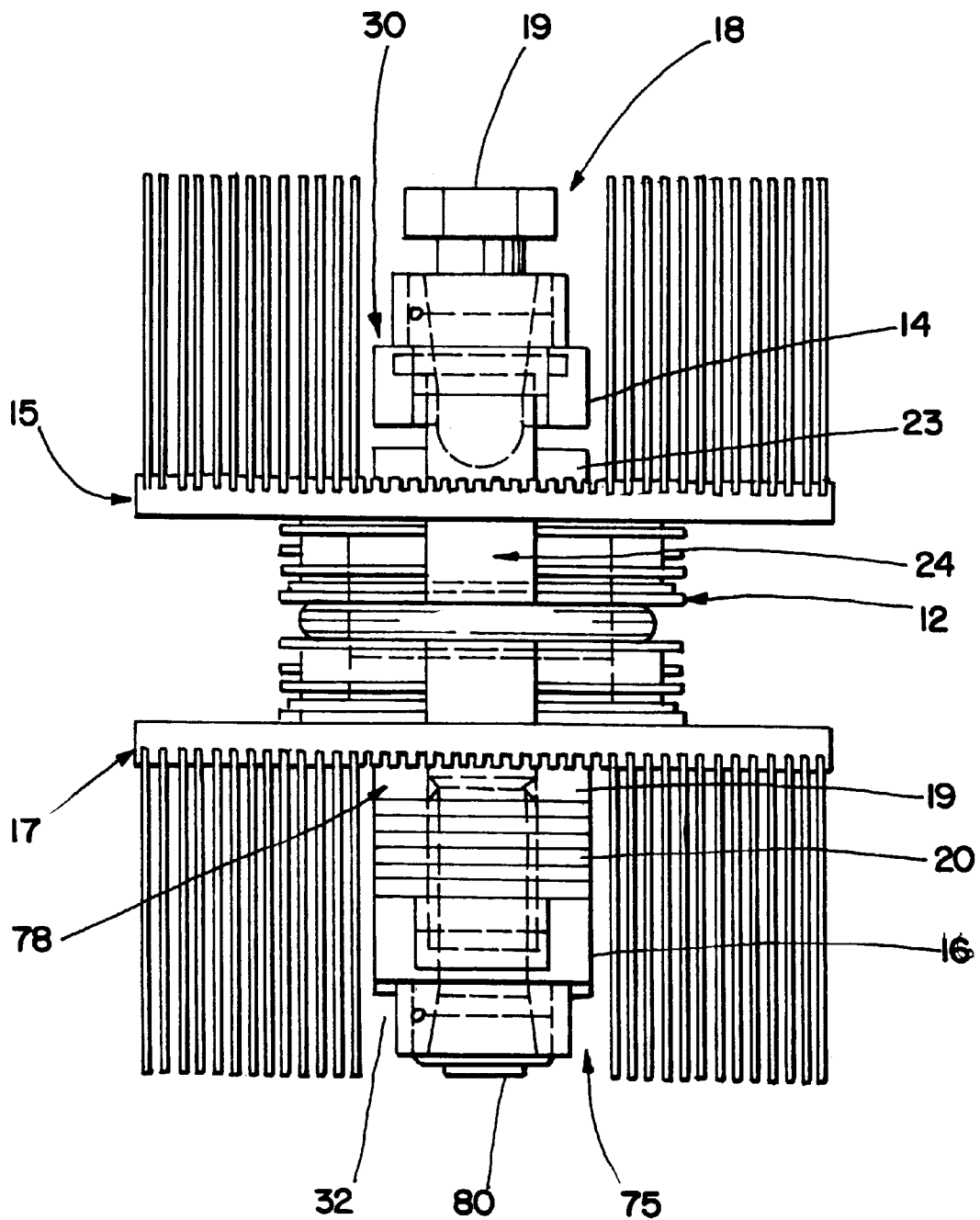
FIG. 2 is a right-side elevational view of the clamping module of FIG. 1.
Figure 4:
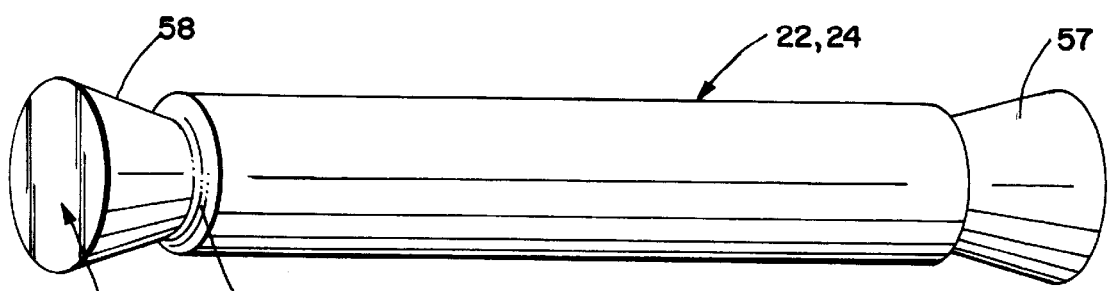
FIG. 4 is a perspective view of the elongated member of FIG. 3.
Figure 7:
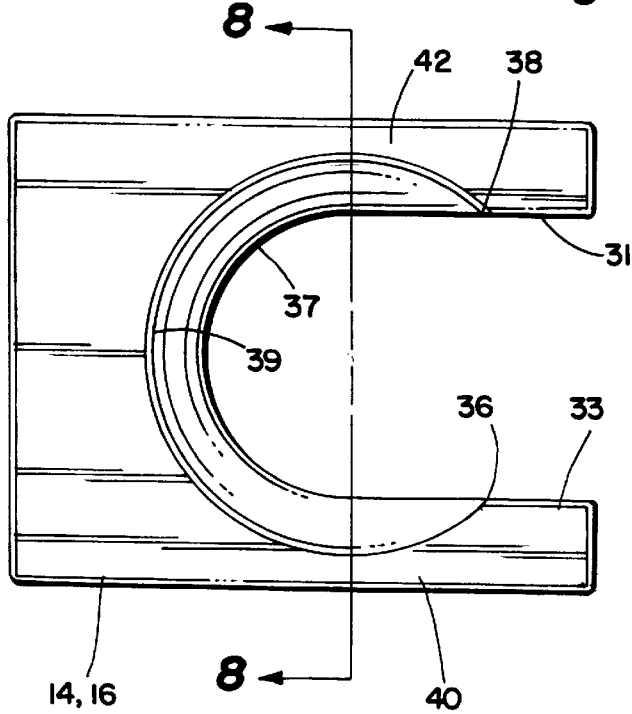
FIG. 7 is an elevational view of a clamping beam of the clamping module of FIGS. 1 and 2.
Figure 8:
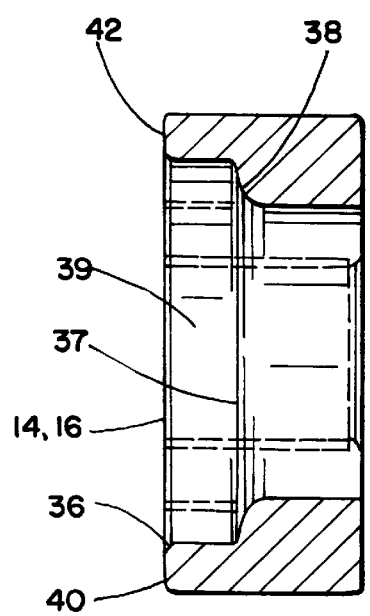
FIG. 8 is a sectional view of the clamping beam of FIG. 7 taken generally along the lines 8—8 of FIG. 7.

Referring now to FIGS. 1 and 2, a clamping arrangement 10 in accordance with the present invention is useful to apply suitable clamping forces to a compression-mounted power electronic device 12 through two heat sinks 15, 17 mounted on opposed sides of the interposed power electronic device 12. The clamping arrangement 10 includes provisions on either side of the power electronic device 12 and the heat sinks 15, 17 for applying predetermined suitable clamping forces, e.g. 10,000–17,000 pounds of clamping force in a specific illustration. To this end, the clamping arrangement 10 includes two spaced apart clamping beams 14, 16, which may also be characterized as bar members, are provided on opposite sides of the power electronic device 12, an operable clamping member 18 carried by the clamping beam 16, and a stack or plurality of spring washers 20 positioned the between the power electronic device 12 and the clamping beam member 16. The clamping arrangement 10 also includes elongated members 22, 24, generally in the shape of rods, for mounting and retaining the clamping beams 14, 16 when the operable member 18 is manipulated to apply clamping force to the power electronic device 12. In a specific illustration, the power electronic device 12 is a semiconductor device such as an SCR, thyristor etc.

The spring washers 20 provide a desirable force distribution, the desired clamping force for appropriate electrical connection of the power electronic device 12, and suitable heat conduction to the heat sinks 15,17. The elongated members 22, 24 are fabricated from an insulating material, and are pultruded fiberglass rods in a specific embodiment. Since there is an impressed electrical potential across the power electronic device 12, electric field stress concentrations must be considered and minimized via the appropriate conformity and interfitting of the various components that interface with the elongated members 22, 24 and the clamping beams which are electrically at the potential at of the power electronic device 12.

The elongated members 22, 24 and the clamping beam members 14, 16 include cooperating structure and arrangements that are generally referred to at 26, 28, 30 and 32 which cooperate to hold the clamping beam members 14, 16 about the power electronic device 12 when clamping force is applied via the operable member 18. For example the operable member 18 includes a threaded bolt 19 that is threadingly received through a threaded portion 34 of the clamping beam member 14 with the bolt 19 extending to apply force to a base plate 21 of the heat sink 15 through an interposed clamping disc 23.

Referring now additionally to FIGS. 3–8, in an illustrative embodiment, the cooperating structure 26, 28, 30 and 32 include widened shoulder portions 44 at the ends of the elongated members 22, 24 that cooperate with the bifurcated ends 31, 33 of the clamping beams 14, 16, e.g. in the illustrative embodiment, extending shoulder portions 36, 38 on the side walls 40, 42 of the clamping beams members 14, 16 that are defined by a circumferential flange 37 defining a shoulder wall 39. Considering important aspects of the present invention and in a preferred embodiment, the widened shoulders 44 are provided via end-fittings 50. The shoulders 44 are defined by a radius of curvature that conforms to the curvature of the surfaces 36, 38 of the side walls 40, 42 of the clamping beams 14, 16. In a specific embodiment, the end fitting 50 includes semicircular split-ring portions 52, 54 which are assembled about tapered ends 55, 57 of the elongated members 22, 24. A retaining ring 56 is positioned over the split-ring portions 52, 54. In a preferred embodiment the end portions 55, 57 of the elongated members 22, 24 each include a narrowing taper 58 defining a diametric shoulder 60. The inner surface of the split-ring portions 52, 54 include a reverse taper at 62, i.e. increasing toward the outer end thereof, and a defined shoulder portion 61 that interfits with the shoulder 60 of the elongated members 22, 24. The neck or bore 63 of the split-ring portions 52, 54 conform to the outer surface of the elongated end members 22, 24. Accordingly when assembled, the end fittings 50 are retained on the elongated members 22, 24 such that when clamping forces are applied, the clamping beam members 14, 16 are retained between the elongated members 22, 24 with the end fittings 50.

In accordance with other aspects of the present invention, a force gauge assembly 75 (FIGS. 1–2) is provided that cooperates with the spring washers 20 to visually indicate when the desired clamping force has been applied via the operable member 18. In a specific embodiment, the force gauge assembly 75 is provided by a washer 76 arranged between a nut 77 and the clamping beam member 14. A clamping rod 78 includes a widened base flange 79 that is assembled against the heat sink base 17 and a threaded rod portion 80 that extends through the spring washers 20 and is threaded onto the nut 77. In operation and during assembly, when the appropriate clamping force has been applied, compression of the spring washers 20 frees the washer 76 thereby indicating that the appropriate clamping force has been achieved.

Considering a specific illustration of assembly of the clamping arrangement 10, one end of each of the elongated members 22, 24 is assembled with the end-fittings 50, the various parts are assembled onto the elongated members, e.g. the lower clamping beam member 16 with the force gauge assembly 75 and spring washers 20, the heat sink 17, the power electronic device 12, the heat sink 15, the upper clamping member 14, and the operable member 18. Then the upper end-fittings 50 at 26, 30 are assembled onto the elongated members 22, 24. Clamping force is then applied via the threaded bolt 19.

As an assembly aid, the split-ring portions 52, 54 are each provided with circumferential groove 41 (FIGS. 5 and 6). During assembly, the split-ring portions 52, 54 are retained in appropriate assembled position with respect to the tapered ends 55, 57 of the elongated members 22, 24 via an 0-ring member 43 (FIG. 3) which is positioned in the groove 41 and about the split-ring portions 52, 54. The retaining ring 56 is then positioned over the retained split-ring portions 52, 54.

Figure 9:
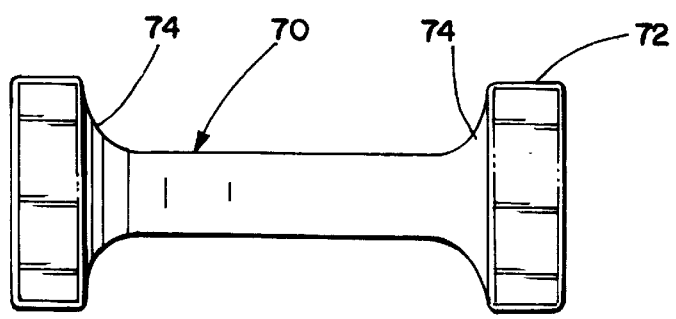
FIG. 9 is an elevational view of an alternate embodiment of the elongated member for use with the clamping module of FIGS. 1 and 2.

In accordance with additional aspects of the present invention and referring now additionally to FIG. 9, an elongated member 70 is utilized in an alternate embodiment in place of the members 22, 24 and the end-fittings 50. For example, the elongated member 70 is fabricated to include widened shoulder portions at 72 and providing at 74 the desirable radius of curvature comparable to the widened shoulder portions 44 provided by the end-fittings 50 as discussed hereinbefore, i.e. to conform to the curvature of the surfaces 36, 38 of the side walls 40, 42 of the clamping beams 14, 16. The elongated member 70 is useful where assembly space is available to accommodate a unitary elongated member in the assembly sequence and/or where lower clamping forces are suitable.

As shown in FIGS. 1 and 2, the present invention may be configured so as to provide side-by-side clamping arrangements 10 and 10a, where the clamping arrangement 10a is identical to the clamping arrangement 10 and the two assemblies 10 and 10a sharing common heat sinks 15, 17. In this manner, the power electronic devices 12 and 12a are connected electrically in a parallel configuration and in a specific embodiment in inverse relationship to form an inverse pair of power electronic devices for application as a power electronic switch, etc. Additionally, in a specific embodiment, each power electronic device 12 is formed by the stacked assembly of two individual devices 82, 84 so as to be in electrical series configuration and arranged for single-sided cooling in the heat sinks 15, 17.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed and desired to be secured by Letters Patent of the United States is:

1. A clamping arrangement for applying clamping force to a power electronic device having at least two predetermined mounting surfaces, the clamping arrangement comprising:

supporting means disposed on either side of the power electronic device so as to be parallel to the predetermined mounting surfaces;

operable clamping means for applying clamping force to the power electronic device via said supporting means; and retaining means that span said supporting means across the power electronic device for retaining said supporting means against said applied clamping force, said retaining means comprising at least two elongated members, said retaining means further comprising first means that are assembled onto said elongated members for interacting with said supporting means, said first means comprising two semicircular portions that are assembled about said end of said elongated member and a retaining ring that is assembled over the assembled said two semicircular portions whereby said two semicircular portions interact with said supporting means to retain said supporting means against said applied clamping force.

2. The clamping arrangement of claim 1 wherein said elongated member includes tapered end portions that widens toward the outer ends, said semicircular portions including an inner taper that matches said taper of said elongated member.

3. The clamping arrangement of claim 2 wherein said elongated member includes a shoulder rim at the narrowed taper portion and said semicircular portions include a corresponding widened section.

4. The clamping arrangement of claim 1 further comprising a heat sink being interposed on each side of the power electronic device interim said clamping means and said devices.

5. The clamping arrangement of claim 1 wherein said supporting means comprises two support beams, said support beams and said elongated members comprising cooperating means for retaining said elongated members in said support beams.

6. A clamping arrangement for applying clamping force to a power electronic device having at least two predetermined mounting surfaces, the clamping arrangement comprising:

supporting means disposed on either side of the power electronic device so as to be parallel to the predetermined mounting surfaces;

operable clamping means for applying clamping force to the power electronic device via said supporting means; and retaining means that span said supporting means across the power electronic device for retaining said supporting means against said applied clamping force, said retaining means comprising at least two elongated members each comprising a first elongated portion and widened end portions at either end thereof, said elongated members further comprising a predetermined contour surface intermediate said first elongated portion and said widened end portions that are defined to cooperate with said support means whereby said elongated members retain said supporting means against said applied damping force.

* * * * *